(12) United States Patent
Wang

(10) Patent No.: US 10,622,082 B2
(45) Date of Patent: Apr. 14, 2020

(54) DISPLAY APPARATUS AND GATE-DRIVER-ON-ARRAY CIRCUIT

(71) Applicants: BOE Technology Group Co., Ltd., Beijing (CN); Ordos Yuansheng Optoelectronics Co., Ltd.

(72) Inventor: Zhengkui Wang, Beijing (CN)

(73) Assignees: BOE Technology Group Co., Ltd., Beijing (CN); Ordos Yuansheng Optoelectronics Co., Ltd., Ordos, Inner Mongolia (CN)

( * ) Notice: Subject to any disclaimer, the term of this patent is extended or adjusted under 35 U.S.C. 154(b) by 0 days.

(21) Appl. No.: 16/099,513

(22) PCT Filed: Dec. 15, 2017

(86) PCT No.: PCT/CN2017/116537
§ 371 (c)(1),
(2) Date: Nov. 7, 2018

(87) PCT Pub. No.: WO2019/113957
PCT Pub. Date: Jun. 20, 2019

(65) Prior Publication Data
US 2019/0189232 A1    Jun. 20, 2019

(51) Int. Cl.
*G09G 3/3266* (2016.01)
*G11C 19/28* (2006.01)
(Continued)

(52) U.S. Cl.
CPC .............. *G11C 19/287* (2013.01); *G09G 3/20* (2013.01); *G11C 19/28* (2013.01);
(Continued)

(58) Field of Classification Search
CPC .................. G09G 3/20; G09G 3/3266; G09G 2300/0408; G09G 2300/0426;
(Continued)

(56) References Cited

U.S. PATENT DOCUMENTS

2003/0156086 A1* 8/2003 Maeda ...................... G06F 3/14
345/89
2006/0056267 A1* 3/2006 Kim ...................... G09G 3/3677
365/230.06
(Continued)

FOREIGN PATENT DOCUMENTS

CN         101866079 B      4/2012
CN         103700334 A      4/2014
(Continued)

OTHER PUBLICATIONS

International Search Report & Written Opinion dated Sep. 4, 2018, regarding PCT/CN2017/116537.

*Primary Examiner* — Michael J Eurice
(74) *Attorney, Agent, or Firm* — Intellectual Valley Law, P.C.

(57) ABSTRACT

The present application discloses a display apparatus having a display area and a peripheral area. The display apparatus includes a gate-driver-on-array circuit in the peripheral area having N numbers of shift register units for respectively outputting a plurality of gate scanning signals to the plurality of gate lines. An n-th shift register unit of the N numbers of shift register units includes an input port for receiving an input signal from an output port of a m-th shift register unit through an input signal line, and a reset port for receiving a reset signal from an output port of a p-th shift register unit through a reset signal line, 1≤m<n<p≤N. At least one of the input signal line and the reset signal line includes a first segment in a same layer as a plurality of gate lines, and a second segment in a same layer as a plurality of data lines.

17 Claims, 7 Drawing Sheets

(51) Int. Cl.
*G09G 3/20* (2006.01)
*H01L 27/12* (2006.01)

(52) U.S. Cl.
CPC .............. *G09G 2300/0408* (2013.01); *G09G 2300/0426* (2013.01); *G09G 2310/0267* (2013.01); *G09G 2310/0286* (2013.01); *G09G 2310/0297* (2013.01); *H01L 27/124* (2013.01)

(58) Field of Classification Search
CPC ... G09G 2310/0251; G09G 2310/0267; G09G 2310/0281; G09G 2310/0286; G09G 2310/0297; H01L 27/124; G11C 19/287; G11C 19/28
See application file for complete search history.

(56) References Cited

U.S. PATENT DOCUMENTS

| | | | |
|---|---|---|---|
| 2008/0036725 A1* | 2/2008 | Lee | G09G 3/3677 345/100 |
| 2008/0067511 A1* | 3/2008 | Kim | G02F 1/136204 257/59 |
| 2010/0156955 A1* | 6/2010 | Kimura | G09G 3/3426 345/690 |
| 2012/0139881 A1* | 6/2012 | Kwon | G09G 3/3677 345/204 |
| 2013/0300775 A1* | 11/2013 | Choi | G02B 26/005 345/690 |
| 2015/0029082 A1* | 1/2015 | Jeon | G11C 19/28 345/98 |
| 2015/0077407 A1* | 3/2015 | Kim | G09G 3/3611 345/204 |
| 2015/0138466 A1* | 5/2015 | Mori | G11C 19/287 349/38 |
| 2015/0205154 A1* | 7/2015 | Koo | G02F 1/1345 349/42 |
| 2016/0013777 A1 | 1/2016 | Duan et al. | |
| 2016/0189659 A1* | 6/2016 | Park | G11C 19/287 345/87 |
| 2016/0202534 A1 | 7/2016 | Chen et al. | |
| 2016/0210920 A1* | 7/2016 | Kim | G09G 3/3677 |
| 2016/0329021 A1* | 11/2016 | Nagayama | G09G 3/36 |
| 2016/0343338 A1 | 11/2016 | Gu et al. | |
| 2017/0194505 A1 | 7/2017 | Cho et al. | |
| 2017/0206853 A1* | 7/2017 | Koide | G09G 3/3648 |

FOREIGN PATENT DOCUMENTS

| | | |
|---|---|---|
| CN | 104485085 A | 4/2015 |
| CN | 104597638 A | 5/2015 |
| CN | 104810003 A | 7/2015 |
| CN | 105552090 A | 5/2016 |
| JP | 2010049768 A | 3/2010 |

* cited by examiner

DISPLAY APPARATUS AND GATE-DRIVER-ON-ARRAY CIRCUIT

CROSS-REFERENCE TO RELATED APPLICATION

This application is a national stage application under 35 U.S.C. § 371 of International Application No. PCT/CN2017/116537, filed Dec. 15, 2017, the contents of which are incorporated by reference in the entirety.

TECHNICAL FIELD

The present invention relates to display technology, more particularly, to a display apparatus and a gate-driver-on-array circuit.

BACKGROUND

Display panels such as liquid crystal display (LCD) panels and organic light-emitting diode display (OLED) panels have been widely used. In recent years, the display panels have been made in various shapes, e.g., a round shape, a polygonal shape, and a triangular shape.

SUMMARY

In one aspect, the present invention provides a display apparatus having a display area and a peripheral area, comprising a plurality of gate lines; a plurality of data lines; an insulating layer between the plurality of gate lines and the plurality of data lines; a gate-driver-on-array circuit in the peripheral area comprising N numbers of shift register units for respectively outputting a plurality of gate scanning signals to the plurality of gate lines; wherein an n-th shift register unit of the N numbers of shift register units comprises an input port for receiving an input signal from an output port of a m-th shift register unit through an input signal line, and a reset port for receiving a reset signal from an output port of a p-th shift register unit through a reset signal line, $1 \leq m < n < p \leq N$; and at least one of the input signal line and the reset signal line comprises a first segment in a same layer as the plurality of gate lines, and a second segment in a same layer as the plurality of data lines; and the first segment and the second segment are electrically connected to each other through a via extending through the insulating layer.

Optionally, the N numbers of shift register units are in a first region of the peripheral area; the input signal line for the n-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer, and the reset signal line for the n-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer.

Optionally, the display apparatus further comprises a plurality of multiplexers; and a plurality of clock terminals; wherein each of the plurality of clock terminals is electrically connected to one of the plurality of data lines; each of the plurality of clock terminals is electrically connected to one of the plurality of multiplexers through a connection line; the connection line is in a same layer as the plurality of gate lines, the first input signal line segment, and the first reset signal line segment; and the connection line crosses over the second input signal line segment and the second reset signal line segment.

Optionally, the plurality of multiplexers are adjacent to the display area; the first region is adjacent to the plurality of multiplexers and on a side of the plurality of multiplexers distal to the display area; and the plurality of clock terminals are on a side of the N numbers of shift register units in the first region distal to the plurality of multiplexers.

Optionally, the N numbers of shift register units are in a second region of the peripheral area; the input signal line for the n-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer; and the reset signal line is an integral signal line in a same layer as the plurality of gate lines.

Optionally, the N numbers of shift register units are in a second region of the peripheral area; the reset signal line for the n-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer; and the input signal line is an integral signal line in a same layer as the plurality of gate lines.

Optionally, the gate-driver-on-array circuit in the peripheral area comprises N1 numbers of shift register units in a first region of the peripheral area, and N2 numbers of shift register units in a second region of the peripheral area; wherein an n1-th shift register unit of the N1 numbers of shift register units comprises an input port for receiving an input signal from an output port of a m1-th shift register unit through an input signal line, and a reset port for receiving a reset signal from an output port of a p1-th shift register unit through a reset signal line, $1 \leq m1 < n1 < p1 \leq N1$; an n2-th shift register unit of the N2 numbers of shift register units comprises an input port for receiving an input signal from an output port of a m2-th shift register unit through an input signal line, and a reset port for receiving a reset signal from an output port of a p2-th shift register unit through a reset signal line, $1 \leq m2 < n2 < p2 \leq N2$; the input signal line for the n1-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer, the reset signal line for the n1-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer; and one of the input signal line and the reset signal line for the n2-th shift register unit comprises a first signal line segment in a same layer as the plurality of gate lines, and a second signal line segment in a same layer as the plurality of data lines, the first signal line segment and the second signal line segment electrically connected to each other through a via extending through the insulating layer.

Optionally, the gate-driver-on-array circuit in the peripheral area further comprises N3 numbers of shift register units in a third region of the peripheral area, and N4 numbers of shift register units in a fourth region of the peripheral area; wherein an n3-th shift register unit of the N3 numbers of shift register units comprises an input port for receiving an input signal from an output port of a m3-th shift register unit through an input signal line, and a reset port for receiving a reset signal from an output port of a p3-th shift register unit through a reset signal line, $1 \leq m3 < n3 < p3 \leq N3$; an n4-th shift register unit of the N4 numbers of shift register units comprises an input port for receiving an input signal from an output port of a m4-th shift register unit through an input signal line, and a reset port for receiving a reset signal from an output port of a p4-th shift register unit through a reset signal line, $1 \leq m4 < n4 < p4 \leq N4$; the input signal line for the n3-th shift register unit comprises a third input signal line segment in a same layer as the plurality of gate lines, and a fourth input signal line segment in a same layer as the plurality of data lines, the third input signal line segment and the fourth input signal line segment electrically connected to each other through a via extending through the insulating layer; the reset signal line for the n3-th shift register unit comprises a third reset signal line segment in a same layer as the plurality of gate lines, and a fourth reset signal line segment in a same layer as the plurality of data lines, the third reset signal line segment and the fourth reset signal line segment electrically connected to each other through a via extending through the insulating layer; and one of the input signal line and the reset signal line for the n4-th shift register unit comprises a third signal line segment in a same layer as the plurality of gate lines, and a fourth signal line segment in a same layer as the plurality of data lines, the third signal line segment and the fourth signal line segment electrically connected to each other through a via extending through the insulating layer.

Optionally, the first region, the second region, the third region, and the fourth region are around a periphery of the display area.

Optionally, the display apparatus further comprises a plurality of multiplexers; and a plurality of clock terminals; wherein each of the plurality of clock terminals is electrically connected to one of the plurality of data lines; each of the plurality of clock terminals is electrically connected to one of the plurality of multiplexers through a connection line; the connection line is in a same layer as the plurality of gate lines, the first input signal line segment, the first reset signal line segment, the third input signal line segment, and the third reset signal line segment; the connection line of each of the plurality of clock terminals adjacent to the first region crosses over the second input signal line segment and the second reset signal line segment; and the connection line of each of the plurality of clock terminals adjacent to the third region crosses over the fourth input signal line segment and the fourth reset signal line segment.

Optionally, the plurality of multiplexers are adjacent to the display area; each of the first region and the third region is adjacent to the plurality of multiplexers and on a side of the plurality of multiplexers distal to the display area; the plurality of clock terminals adjacent to the first region are on a side of the N1 numbers of shift register units in the first region distal to the plurality of multiplexers; and the plurality of clock terminals adjacent to the third region are on a side of the N3 numbers of shift register units in the third region distal to the plurality of multiplexers.

Optionally, the display apparatus further comprises a rapid discharger adjacent to the display area; and each of the second region and the fourth region is adjacent to the rapid discharger and on a side of the rapid discharger distal to the display area.

Optionally, the input signal line for the n2-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer, and the reset signal line in the second region is an integral signal line in a same layer as the plurality of gate lines.

Optionally, the input signal line for the n2-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer; the input signal line for the n4-th shift register unit comprises a third input signal line segment in a same layer as the plurality of gate lines, and a fourth input signal line segment in a same layer as the plurality of data lines, the third input signal line segment and the fourth input signal line segment electrically connected to each other through a via extending through the insulating layer; the reset signal line in the second region is an integral signal line in a same layer as the plurality of gate lines; and the reset signal line in the fourth region is an integral signal line in a same layer as the plurality of gate lines.

Optionally, the display apparatus further comprises a fan-out area adjacent to the plurality of clock terminals, and on a side of the plurality of clock terminals distal to the plurality of multiplexers.

Optionally, the display area has a non-rectangular and non-square shape.

Optionally, the display area has a substantially circular shape.

Optionally, m is (n−1), and p is (n+1).

Optionally, the display apparatus is a smart watch.

In another aspect, the present invention provides a gate-driver-on-array circuit in a peripheral area of a display apparatus, comprising N numbers of shift register units for respectively outputting a plurality of gate scanning signals to a plurality of gate lines; wherein an n-th shift register unit of the N numbers of shift register units comprises an input port for receiving an input signal from an output port of a m-th shift register unit through an input signal line, and a reset port for receiving a reset signal from an output port of a p-th shift register unit through a reset signal line, $1 \leq m < n < p \leq N$; at least one of the input signal line and the reset signal line comprises a first segment in a same layer as the plurality of gate lines in the display apparatus, and a second segment in a same layer as a plurality of data lines in the display apparatus; and the first segment and the second segment are electrically connected to each other through a via extending through an insulating layer.

Optionally, the N numbers of shift register units are in a first region of the peripheral area; the input signal line for the n-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer; and the reset signal line for the n-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer.

Optionally, the N numbers of shift register units are in a second region of the peripheral area; the input signal line for the n-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer; and the reset signal line is an integral signal line in a same layer as the plurality of gate lines.

Optionally, the N numbers of shift register units are in a second region of the peripheral area; the reset signal line for the n-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer; and the input signal line is an integral signal line in a same layer as the plurality of gate lines.

Optionally, the gate-driver-on-array circuit comprises N1 numbers of shift register units in a first region of the peripheral area, and N2 numbers of shift register units in a second region of the peripheral area; wherein an n1-th shift register unit of the N1 numbers of shift register units comprises an input port for receiving an input signal from an output port of a m1-th shift register unit through an input signal line, and a reset port for receiving a reset signal from an output port of a p1-th shift register unit through a reset signal line, $1 \leq m1 < n1 < p1 \leq N1$; an n2-th shift register unit of the N2 numbers of shift register units comprises an input port for receiving an input signal from an output port of a m2-th shift register unit through an input signal line, and a reset port for receiving a reset signal from an output port of a p2-th shift register unit through a reset signal line, $1 \leq m2 < n2 < p2 \leq N2$; the input signal line for the n1-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer, the reset signal line for the n1-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer, and one of the input signal line and the reset signal line for the n2-th shift register unit comprises a first signal line segment in a same layer as the plurality of gate lines, and a second signal line segment in a same layer as the plurality of data lines, the first signal line segment and the second signal line segment electrically connected to each other through a via extending through the insulating layer.

Optionally, the gate-driver-on-array circuit in the peripheral area further comprises N3 numbers of shift register units in a third region of the peripheral area, and N4 numbers of shift register units in a fourth region of the peripheral area; wherein an n3-th shift register unit of the N3 numbers of shift register units comprises an input port for receiving an input signal from an output port of a m3-th shift register unit through an input signal line, and a reset port for receiving a reset signal from an output port of a p3-th shift register unit through a reset signal line, $1 \leq m3 < n3 < p3 \leq N3$; an n4-th shift register unit of the N4 numbers of shift register units comprises an input port for receiving an input signal from an output port of a m4-th shift register unit through an input signal line, and a reset port for receiving a reset signal from an output port of a p4-th shift register unit through a reset signal line, $1 \leq m4 < n4 < p4 \leq N4$; the input signal line for the n3-th shift register unit comprises a third input signal line segment in a same layer as the plurality of gate lines, and a fourth input signal line segment in a same layer as the plurality of data lines, the third input signal line segment and the fourth input signal line segment electrically connected to each other through a via extending through the insulating layer; the reset signal line for the n3-th shift register unit comprises a third reset signal line segment in a same layer as the plurality of gate lines, and a fourth reset signal line segment in a same layer as the plurality of data lines, the third reset signal line segment and the fourth reset signal line segment electrically connected to each other through a via extending through the insulating layer; and one of the input signal line and the reset signal line for the n4-th shift register unit comprises a third signal line segment in a same layer as the plurality of gate lines, and a fourth signal line segment in a same layer as the plurality of data lines, the third signal line segment and the fourth signal line segment electrically connected to each other through a via extending through the insulating layer.

Optionally, the first region, the second region, the third region, and the fourth region are around a periphery of a display area of the display apparatus.

Optionally, the input signal line for the n2-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer, and the reset signal line in the second region is an integral signal line in a same layer as the plurality of gate lines.

Optionally, the input signal line for the n2-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer, the input signal line for the n4-th shift register unit comprises a third input signal line segment in a same layer as the plurality of gate lines, and a fourth input signal line segment in a same layer as the plurality of data lines, the third input signal line segment and the fourth input signal line segment electrically connected to each other through a via extending through the insulating layer; the reset signal line in the second region is an integral signal line in a same layer as the plurality of gate lines; and the reset signal line in the fourth region is an integral signal line in a same layer as the plurality of gate lines.

Optionally, m is (n−1), and p is (n+1).

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display apparatus and a gate-driver-on-array circuit that substantially obviate one or more of the problems due to limitations and disadvantages of the related art. In one aspect, the present disclosure provides a gate-driver-on-array circuit in a peripheral area of a display apparatus. In some embodiments, the gate-driver-on-array circuit includes N numbers of shift register units for respectively outputting a plurality of gate scanning signals to a plurality of gate lines in a display apparatus. Optionally, an n-th shift register unit of the N numbers of shift register units includes an input port for receiving an input signal from an output port of a m-th shift register unit through an input signal line, and a reset port for receiving a reset signal from an output port of a p-th shift register unit through a reset signal line, $1 \leq m < n < p \leq N$. Optionally, m is (n−1). Optionally, p is (n+1). Optionally, m is (n−2). Optionally, p is (n+2). Optionally, m is (n−3). Optionally, p is (n+3). Optionally, at least one of the input signal line and the reset signal line includes a first segment in a same layer as the plurality of gate lines in the display apparatus, and a second segment in a same layer as a plurality of data lines in the display apparatus. Optionally, the first segment and the second segment are electrically connected to each other through a via extending through an insulating layer.

Figure 1:
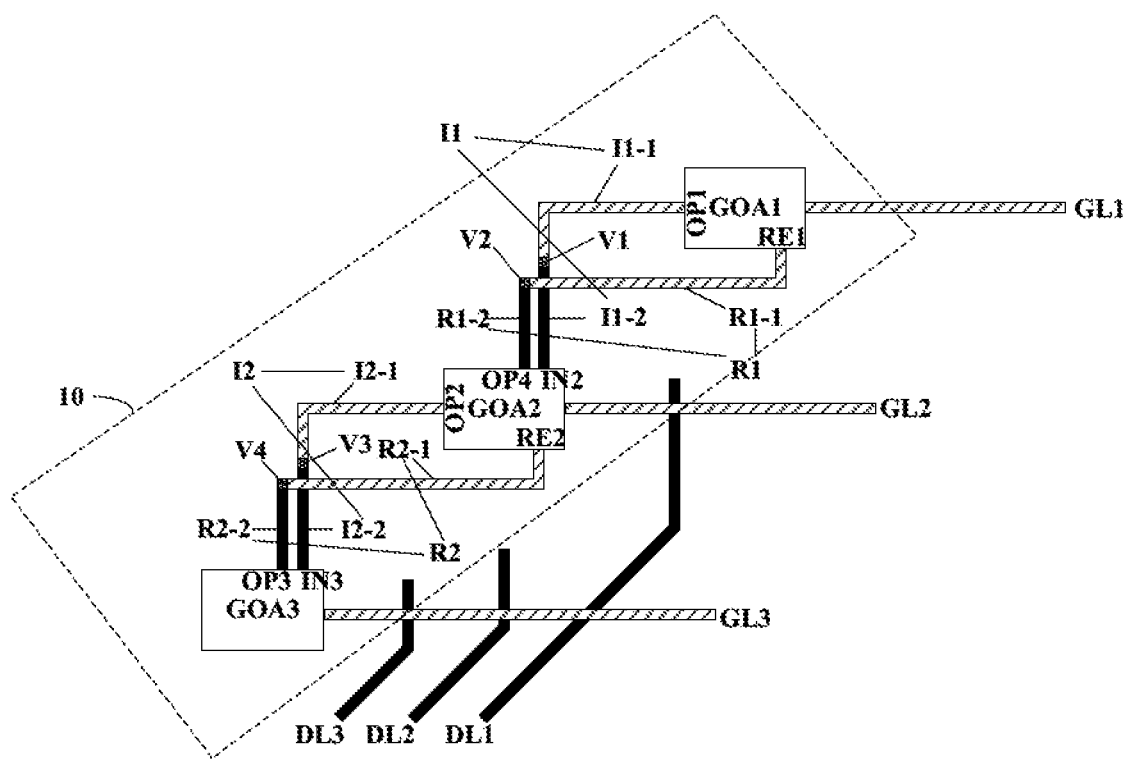
FIG. 1 is a schematic diagram illustrating the structure of a gate-driver-on-array circuit in some embodiments according to the present disclosure.

FIG. 1 is a schematic diagram illustrating the structure of a gate-driver-on-array circuit in some embodiments according to the present disclosure. Referring to FIG. 1, the gate-driver-on-array circuit in some embodiments includes N numbers of shift register units cascaded in series for respectively outputting a plurality of gate scanning signals to a plurality of gate lines in a display apparatus. An n-th shift register unit of the N numbers of shift register units includes an input port for receiving an input signal from an output port of a m-th (e.g., an (n−1)-th) shift register unit through an input signal line, and a reset port for receiving a reset signal from an output port of a p-th (e.g., an (n+1)-th) shift register unit through a reset signal line, $1 \leq m < n < p \leq N$. As shown in FIG. 1, three shift register units GOA1, GOA2, GOA3 are cascaded in series. The shift register units GOA1, GOA2, GOA3 respectively output gate scanning signals to gate lines GL1, GL2, and GL3. The shift register unit GOA2 includes an input port IN2 for receiving an input signal from an output port OP1 of the shift register unit GOA1 through an input signal line I1. The shift register unit GOA2 further includes a reset port RE2 for receiving a reset signal from an output port OP3 of the shift register unit GOA3 through a reset signal line R2. Similarly, the shift register unit GOA1 includes a reset port RE1 for receiving a reset signal from an output port OP4 of the shift register unit GOA2 through a reset signal line R1. The shift register unit GOA3 includes an input port IN3 for receiving an input signal from an output port OP2 of the shift register unit GOA2 through an input signal line I2. In the present gate-driver-on-array circuit at least one of the input signal line and the reset signal line includes a first segment in a same layer as the plurality of gate lines in the display apparatus, and a second segment in a same layer as a plurality of data lines in the display apparatus. The first segment and the second segment are electrically connected to each other through a via extending through an insulating layer.

In some embodiments, the input signal line for the n-th shift register unit includes a first input signal line segment in a same layer as the plurality of gate lines, and a second input signal line segment in a same layer as the plurality of data lines, the first input signal line segment and the second input signal line segment electrically connected to each other through a via extending through the insulating layer, and the reset signal line for the n-th shift register unit includes a first reset signal line segment in a same layer as the plurality of gate lines, and a second reset signal line segment in a same layer as the plurality of data lines, the first reset signal line segment and the second reset signal line segment electrically connected to each other through a via extending through the insulating layer. Referring to FIG. 1, the N numbers of shift register units are in a first region 10 of the peripheral area. The input signal line I1 for the shift register unit GOA2 includes a first input signal line segment I1-1 in a same layer as the plurality of gate lines GL1, GL2, and GL3; and a second input signal line segment I1-2 in a same layer as the plurality of data lines DL1, DL2, and DL3. The first input signal line segment I1-1 and the second input signal line segment I1-2 are electrically connected to each other through a via V1 extending through an insulating layer separating a layer containing the plurality of gate lines from a layer containing the plurality of data lines. The reset signal line R2 for the shift register unit GOA2 includes a first reset signal line segment R2-1 in a same layer as the plurality of gate lines GL1, GL2, and GL3; and a second reset signal line segment R2-2 in a same layer as the plurality of data lines DL1, DL2, and DL3. The first reset signal line segment R2-1 and the second reset signal line segment R2-2 are electrically connected to each other through a via V4 extending through the insulating layer separating the layer containing the plurality of gate lines from the layer containing the plurality of data lines. Similarly, the input signal line I2 for the shift register unit GOA3 includes a first input signal line segment I2-1 in a same layer as the plurality of gate lines GL1, GL2, and GL3; and a second input signal line segment I2-2 in a same layer as the plurality of data lines DL1, DL2, and DL3. The first input signal line segment I2-1 and the second input signal line segment I2-2 are electrically connected to each other through a via V3 extending through the insulating layer separating the layer containing the plurality of gate lines from the layer containing the plurality of data lines. Similarly, the reset signal line R1 for the shift register unit GOA1 includes a first reset signal line segment R1-1 in a same layer as the plurality of gate lines GL1, GL2, and GL3; and a second reset signal line segment R1-2 in a same layer as the plurality of data lines DL1, DL2, and DL3. The first reset signal line segment R1-1 and the second reset signal line segment R1-2 are electrically connected to each other through a via V2 extending through the insulating layer separating the layer containing the plurality of gate lines from the layer containing the plurality of data lines.

Figure 2:
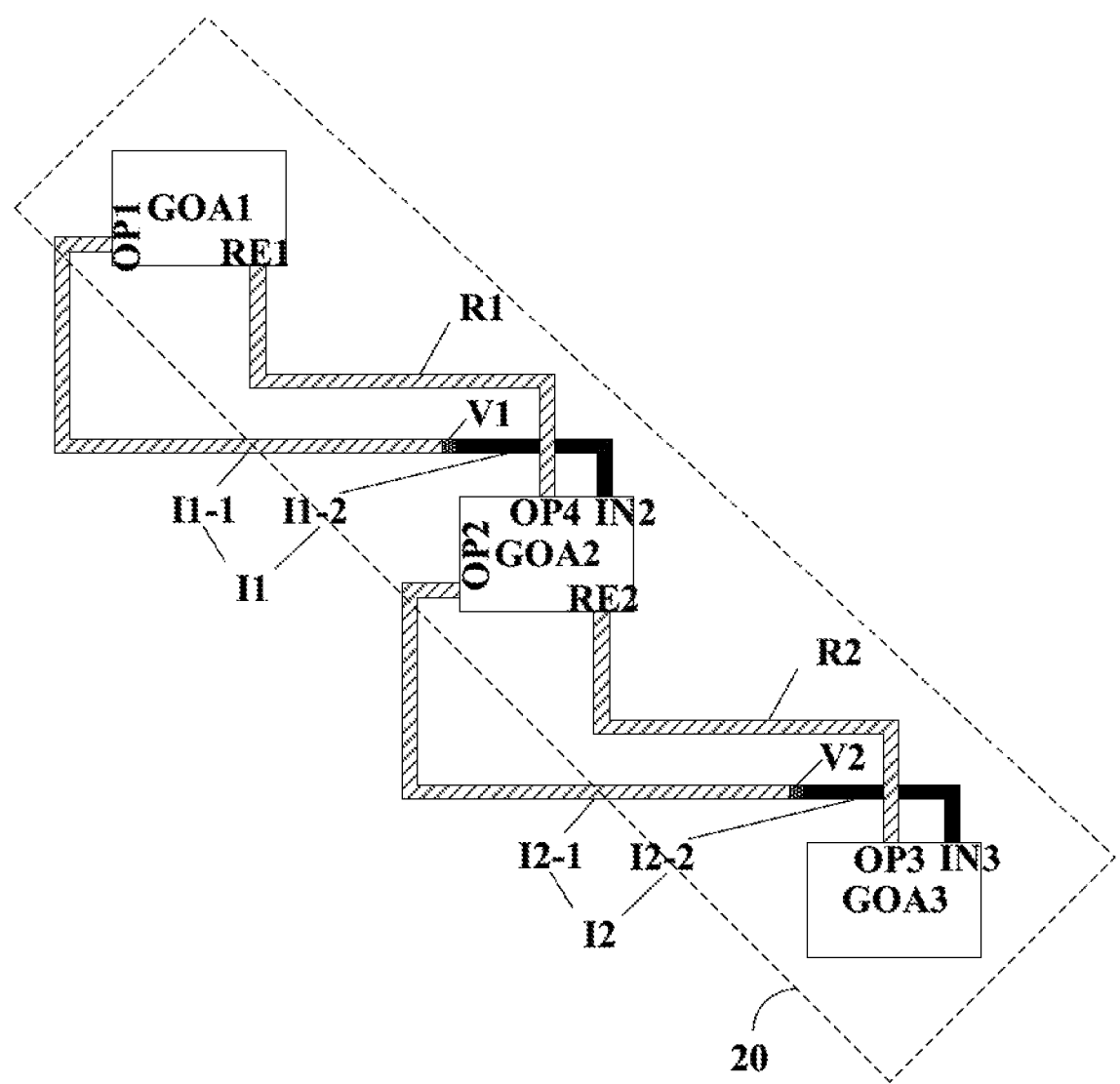
FIG. 2 is a schematic diagram illustrating the structure of a gate-driver-on-array circuit in some embodiments according to the present disclosure.

In some embodiments, the input signal line for the n-th shift register unit includes a first input signal line segment in a same layer as the plurality of gate lines, and a second input signal line segment in a same layer as the plurality of data lines, the first input signal line segment and the second input signal line segment electrically connected to each other through a via extending through the insulating layer. FIG. 2 is a schematic diagram illustrating the structure of a gate-driver-on-array circuit in some embodiments according to the present disclosure. Referring to FIG. 2, the N numbers of shift register units are in a second region 20 of the peripheral area. Three shift register units GOA1, GOA2, GOA3 are cascaded in series. The input signal line I1 for the shift register unit GOA2 includes a first input signal line segment I1-1 in a same layer as the plurality of gate lines; and a second input signal line segment I1-2 in a same layer as the plurality of data lines. The first input signal line segment I1-1 and the second input signal line segment I1-2 are electrically connected to each other through a via V1 extending through the insulating layer separating the layer containing the plurality of gate lines from the layer containing the plurality of data lines. Similarly, the input signal line I2 for the shift register unit GOA3 includes a first input signal line segment I2-1 in a same layer as the plurality of gate lines; and a second input signal line segment I2-2 in a same layer as the plurality of data lines. The first input signal line segment I2-1 and the second input signal line segment I2-2 are electrically connected to each other through a via V2 extending through the insulating layer separating the layer containing the plurality of gate lines from the layer containing the plurality of data lines. The reset signal line R1 for the shift register unit GOA1 is an integral signal line in a same layer as the plurality of gate lines. The reset signal line R2 for the shift register unit GOA2 is an integral signal line in a same layer as the plurality of gate lines. Optionally, the reset signal line in the second region crosses over the second input signal line segment. For example, the reset signal line R1 for the shift register unit GOA1 crosses over the second input signal line segment I1-2. The reset signal line R2 for the shift register unit GOA2 crosses over the second input signal line segment I2-2.

Figure 3:
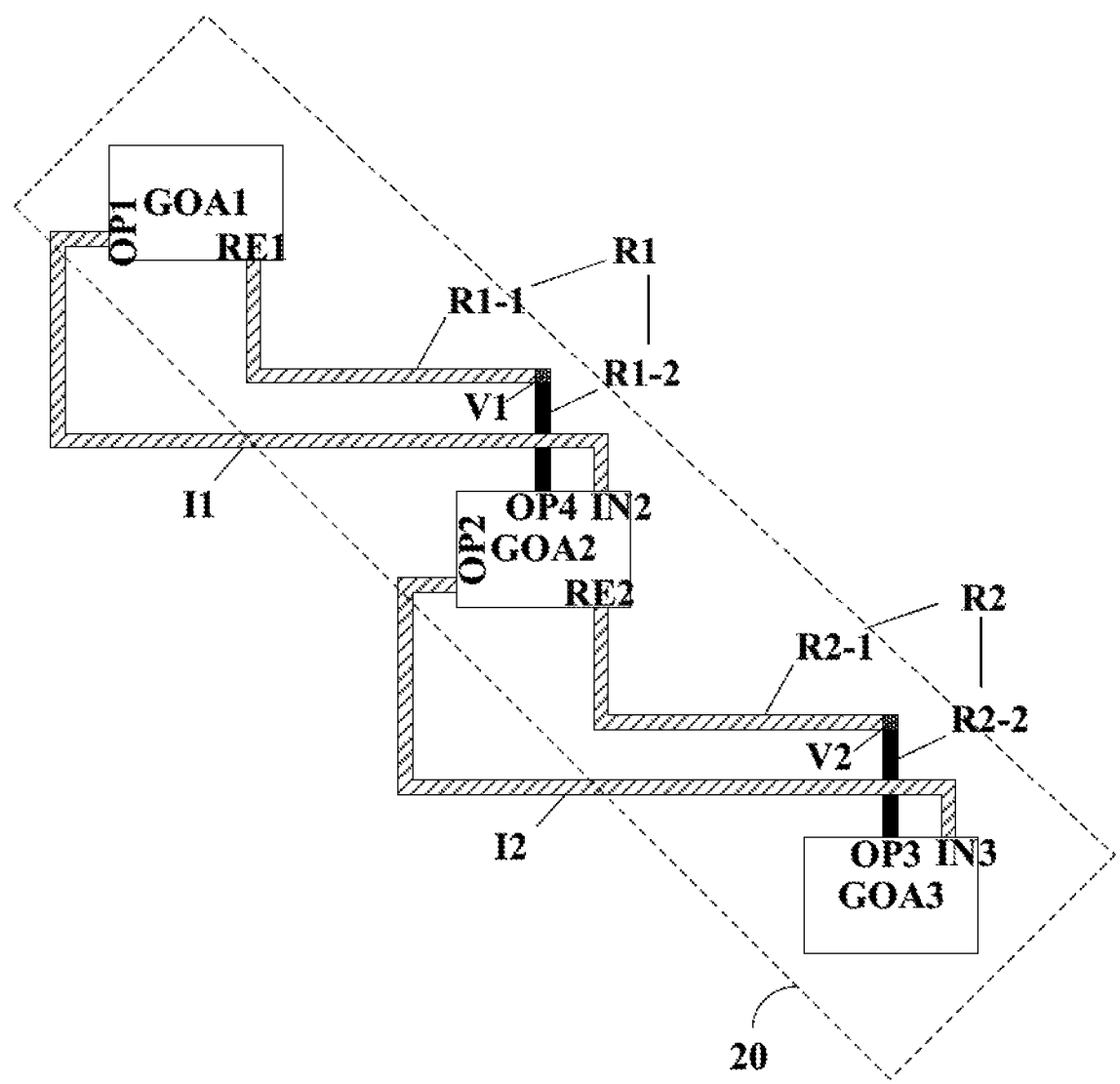
FIG. 3 is a schematic diagram illustrating the structure of a gate-driver-on-array circuit in some embodiments according to the present disclosure.

In some embodiments, the reset signal line for the n-th shift register unit includes a first reset signal line segment in a same layer as the plurality of gate lines, and a second reset signal line segment in a same layer as the plurality of data lines, the first reset signal line segment and the second reset signal line segment electrically connected to each other through a via extending through the insulating layer. FIG. 3 is a schematic diagram illustrating the structure of a gate-driver-on-array circuit in some embodiments according to the present disclosure. Referring to FIG. 3, the N numbers of shift register units are in a second region 20 of the peripheral area. Three shift register units GOA1, GOA2, GOA3 are cascaded in series. The reset signal line R2 for the shift register unit GOA2 includes a first reset signal line segment R2-1 in a same layer as the plurality of gate lines, and a second reset signal line segment R2-2 in a same layer as the plurality of data lines. The first reset signal line segment R2-1 and the second reset signal line segment R2-2 are electrically connected to each other through a via V2 extending through the insulating layer separating the layer containing the plurality of gate lines from the layer containing the plurality of data lines. Similarly, the reset signal line R1 for the shift register unit GOA1 includes a first reset signal line segment R1-1 in a same layer as the plurality of gate lines, and a second reset signal line segment R1-2 in a same layer as the plurality of data lines. The first reset signal line segment R1-1 and the second reset signal line segment R1-2 are electrically connected to each other through a via V1 extending through the insulating layer separating the layer containing the plurality of gate lines from the layer containing the plurality of data lines. The input signal line I1 for the shift register unit GOA2 is an integral signal line in a same layer as the plurality of gate lines. The input signal line I2 for the shift register unit GOA3 is an integral signal line in a same layer as the plurality of gate lines. Optionally, the input signal line in the second region crosses over the second reset signal line segment. For example, the input signal line I1 for the shift register unit GOA2 crosses over the second reset signal line segment R1-2. The input signal line I2 for the shift register unit GOA3 crosses over the second reset signal line segment R2-2.

In some embodiments, the gate-driver-on-array circuit includes N1 numbers of shift register units cascaded in series in a first region of the peripheral area (e.g., the first region as depicted in FIG. 1), and N2 numbers of shift register units cascaded in series in a second region of the peripheral area (e.g., the second region as depicted in FIG. 2 or the second region as depicted in FIG. 3). An n1-th shift register unit of the N1 numbers of shift register units includes an input port for receiving an input signal from an output port of a m1-th (e.g., an (n1−1)-th) shift register unit through an input signal line, and a reset port for receiving a reset signal from an output port of a p1-th (e.g., an (n1+1)-th) shift register unit through a reset signal line, $1 \leq m1 < n1 < p1 \leq N1$. Optionally, m1 is (n1−1). Optionally, p1 is (n1+1). Optionally, m1 is (n1−2). Optionally, p1 is (n1+2). Optionally, m1 is (n1−3). Optionally, p1 is (n1+3). An n2-th shift register unit of the N2 numbers of shift register units includes an input port for receiving an input signal from an output port of a m2-th (e.g., an (n2−1)-th) shift register unit through an input signal line, and a reset port for receiving a reset signal from an output port of a p2-th (e.g., an (n2+1)-th) shift register unit through a reset signal line, $1 \leq m2 < n2 < p2 \leq N2$. Optionally, m2 is (n2−1). Optionally, p2 is (n2+1). Optionally, m2 is (n2−2). Optionally, p2 is (n2+2). Optionally, m2 is (n2−3). Optionally, p2 is (n2+3). The input signal line for the n1-th shift register unit includes a first input signal line segment in a same layer as the plurality of gate lines, and a second input signal line segment in a same layer as the plurality of data lines, the first input signal line segment and the second input signal line segment electrically connected to each other through a via extending through the insulating layer. The reset signal line for the n1-th shift register unit includes a first reset signal line segment in a same layer as the plurality of gate lines, and a second reset signal line segment in a same layer as the plurality of data lines, the first reset signal line segment and the second reset signal line segment electrically connected to each other through a via extending through the insulating layer. One of the input signal line and the reset signal line for the n2-th shift register unit includes a first signal line segment in a same layer as the plurality of gate lines, and a second signal line segment in a same layer as the plurality of data lines, the first signal line segment and the second signal line segment electrically connected to each other through a via extending through the insulating layer. Optionally, the input signal line for the n2-th shift register unit includes a first input signal line segment in a same layer as the plurality of gate lines, and a second input signal line segment in a same layer as the plurality of data lines, the first input signal line segment and the second input signal line segment electrically connected to each other through a via extending through the insulating layer, and the reset signal line in the second region crosses over the second input signal line segment (as depicted in FIG. 2). Optionally, the reset signal line for the n2-th shift register unit includes a first reset signal line segment in a same layer as the plurality of gate lines, and a second reset signal line segment in a same layer as the plurality of data lines, the first reset signal line segment and the second reset signal line segment electrically connected to each other through a via extending through the insulating layer, and the input signal line in the second region crosses over the second reset signal line segment (as depicted in FIG. 3).

In some embodiments, the gate-driver-on-array circuit further includes N3 numbers of shift register units cascaded in series in a third region of the peripheral area, and N4 numbers of shift register units cascaded in series in a fourth region of the peripheral area. An n3-th shift register unit of the N3 numbers of shift register units includes an input port for receiving an input signal from an output port of a m3-th (e.g., an (n3−1)-th) shift register unit through an input signal line, and a reset port for receiving a reset signal from an output port of a p3-th (e.g., an (n3+1)-th) shift register unit through a reset signal line, $1 \leq m3 < n3 < p3 \leq N3$. Optionally, m3 is (n3−1). Optionally, p3 is (n3+1). Optionally, m3 is (n3−2). Optionally, p3 is (n3+2). Optionally, m3 is (n3−3). Optionally, p3 is (n3+3). An n4-th shift register unit of the N4 numbers of shift register units includes an input port for receiving an input signal from an output port of a m4-th (e.g., an (n4−1)-th) shift register unit through an input signal line, and a reset port for receiving a reset signal from an output port of a p4-th (e.g., an (n4+1)-th) shift register unit through a reset signal line, $1 \leq m4 < n4 < p4 \leq N4$. Optionally, m4 is (n4−1). Optionally, p4 is (n4+1). Optionally, m4 is (n4−2). Optionally, p4 is (n4+2). Optionally, m4 is (n4−3). Optionally, p4 is (n4+3). The input signal line for the n3-th shift register unit includes a third input signal line segment in a same layer as the plurality of gate lines, and a fourth input signal line segment in a same layer as the plurality of data lines, the third input signal line segment and the fourth input signal line segment electrically connected to each other through a via extending through the insulating layer. The reset signal line for the n3-th shift register unit includes a third reset signal line segment in a same layer as the plurality of gate lines, and a fourth reset signal line segment in a same layer as the plurality of data lines, the third reset signal line segment and the fourth reset signal line segment electrically connected to each other through a via extending through the insulating layer. One of the input signal line and the reset signal line for the n4-th shift register unit includes a third signal line segment in a same layer as the plurality of gate lines, and a fourth signal line segment in a same layer as the plurality of data lines, the third signal line segment and the fourth signal line segment electrically connected to each other through a via extending through the insulating layer. Optionally, the input signal line for the n4-th shift register unit includes a first input signal line segment in a same layer as the plurality of gate lines, and a second input signal line segment in a same layer as the plurality of data lines, the first input signal line segment and the second input signal line segment electrically connected to each other through a via extending through the insulating layer, and the reset signal line in the fourth region crosses over the second input signal line segment. Optionally, the reset signal line for the n4-th shift register unit includes a first reset signal line segment in a same layer as the plurality of gate lines, and a second reset signal line segment in a same layer as the plurality of data lines, the first reset signal line segment and the second reset signal line segment electrically connected to each other through a via extending through the insulating layer, and the input signal line in the fourth region crosses over the second reset signal line segment.

Optionally, the first region, the second region, the third region, and the fourth region are around a periphery of a display area of the display apparatus.

Figure 4:
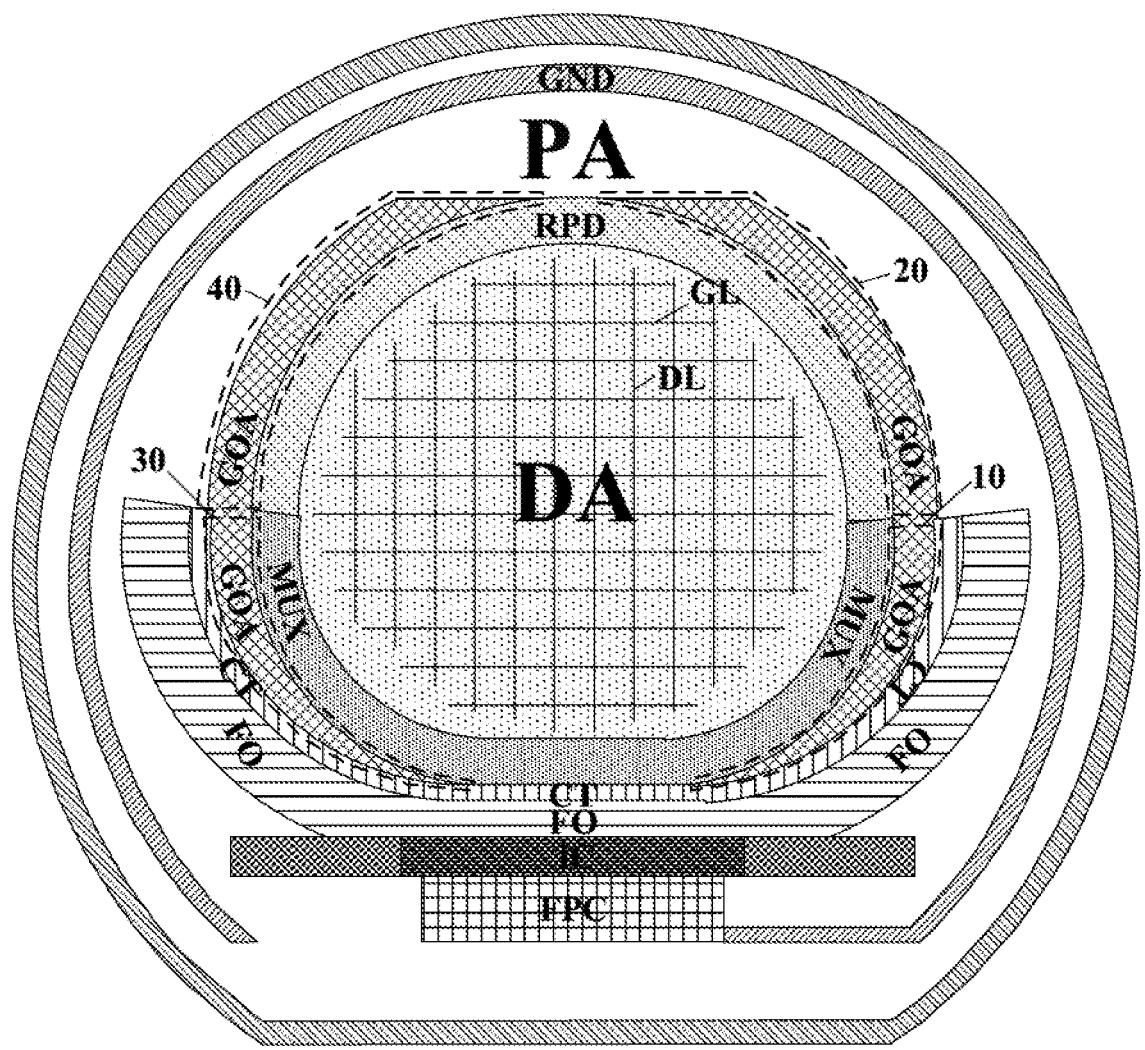
FIG. 4 is a schematic diagram illustrating the structure of a display apparatus in some embodiments according to the present disclosure.

In another aspect, the present disclosure provides a display apparatus having a gate-driver-on-array circuit described herein. In some embodiments, the display apparatus has a display area and a peripheral area. FIG. 4 is a schematic diagram illustrating the structure of a display apparatus in some embodiments according to the present disclosure. Referring to FIG. 4, the display apparatus has a display area DA and a peripheral area PA outside the display area DA. In some embodiments, the display apparatus includes a plurality of gate lines GL, a plurality of data lines DL, and an insulating layer between the plurality of gate lines GL and the plurality of data lines DL. Optionally, the display apparatus includes a gate-driver-on-array circuit GOA in the peripheral area PA. The gate-driver-on-array circuit GOA includes a plurality of shift register units cascaded in series for respectively outputting a plurality of gate scanning signals to the plurality of gate lines GL. As discussed above, in some embodiments, the gate-driver-on-array circuit GOA includes N numbers of shift register units cascaded in series for respectively outputting a plurality of gate scanning signals to the plurality of gate lines. An n-th shift register unit of the N numbers of shift register units includes an input port for receiving an input signal from an output port of a m-th (e.g., an (n−1)-th) shift register unit through an input signal line, and a reset port for receiving a reset signal from an output port of a p-th (e.g., an (n+1)-th) shift register unit through a reset signal line, $1 \leq m < n < p \leq N$. Optionally, m is (n−1). Optionally, p is (n+1). Optionally, m is (n−2). Optionally, p is (n+2). Optionally, m is (n−3). Optionally, p is (n+3). Optionally, at least one of the input signal line and the reset signal line includes a first segment in a same layer as the plurality of gate lines, and a second segment in a same layer as the plurality of data lines. The first segment and the second segment are electrically connected to each other through a via extending through the insulating layer.

In FIG. 4, the gate-driver-on-array circuit GOA is disposed in four regions of the display apparatus, e.g., a first region 10, a second region 20, a third region 30, and a fourth region 40. The first region 10, the second region 20, the third region 30, and the fourth region 40 are in the peripheral area PA and are around a periphery of a display area DA.

Figure 5:
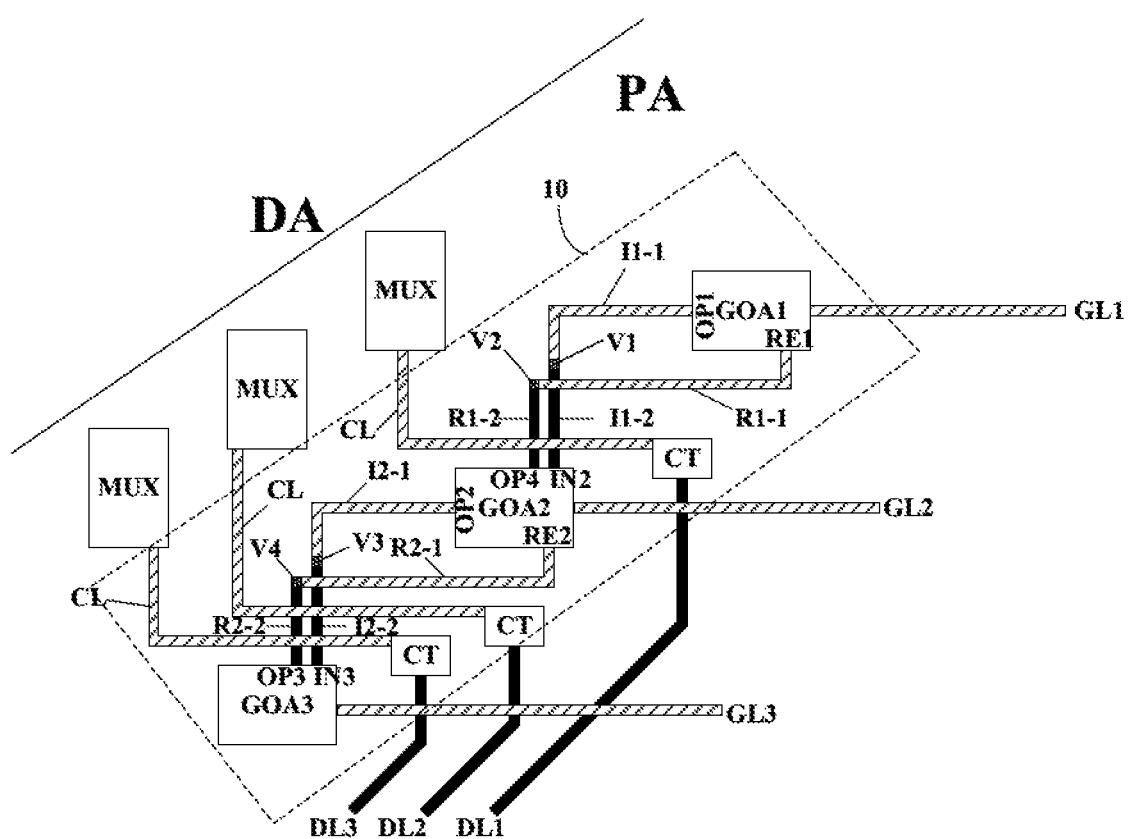
FIG. 5 is a schematic diagram illustrating the structure of a region of a display apparatus in some embodiments according to the present disclosure.

FIG. 5 is a schematic diagram illustrating the structure of a region of a display apparatus in some embodiments according to the present disclosure. FIG. 5 shows a region of the display apparatus around the first region 10 corresponding to the gate-driver-on-array circuit as shown in FIG. 1. Referring to FIG. 5, FIG. 4, and FIG. 1, the gate-driver-on-array circuit GOA in some embodiments includes N numbers of shift register units cascaded in series for respectively outputting a plurality of gate scanning signals to a plurality of gate lines in a display apparatus. An n-th shift register unit of the N numbers of shift register units includes an input port for receiving an input signal from an output port of a m-th (e.g., an (n−1)-th) shift register unit through an input signal line, and a reset port for receiving a reset signal from an output port of a p-th (e.g., an (n+1)-th) shift register unit through a reset signal line, 1≤m<n<p≤N. Optionally, m is (n−1). Optionally, p is (n+1). Optionally, m is (n−2). Optionally, p is (n+2). Optionally, m is (n−3). Optionally, p is (n+3). As shown in FIG. 5 and FIG. 1, three shift register units GOA1, GOA2, GOA3 are cascaded in series. The shift register units GOA1, GOA2, GOA3 respectively output gate scanning signals to gate lines GL1, GL2, and GL3. The shift register unit GOA2 includes an input port IN2 for receiving an input signal from an output port OP1 of the shift register unit GOA1 through an input signal line I1. The shift register unit GOA2 further includes a reset port RE2 for receiving a reset signal from an output port OP3 of the shift register unit GOA3 through a reset signal line R2. Similarly, the shift register unit GOA1 includes a reset port RE1 for receiving a reset signal from an output port OP4 of the shift register unit GOA2 through a reset signal line R1. The shift register unit GOA3 includes an input port IN3 for receiving an input signal from an output port OP2 of the shift register unit GOA2 through an input signal line I2. In the present gate-driver-on-array circuit at least one of the input signal line and the reset signal line includes a first segment in a same layer as the plurality of gate lines in the display apparatus, and a second segment in a same layer as a plurality of data lines in the display apparatus. The first segment and the second segment are electrically connected to each other through a via extending through an insulating layer.

In some embodiments, the input signal line for the n-th shift register unit includes a first input signal line segment in a same layer as the plurality of gate lines, and a second input signal line segment in a same layer as the plurality of data lines, the first input signal line segment and the second input signal line segment electrically connected to each other through a via extending through the insulating layer, and the reset signal line for the n-th shift register unit includes a first reset signal line segment in a same layer as the plurality of gate lines, and a second reset signal line segment in a same layer as the plurality of data lines, the first reset signal line segment and the second reset signal line segment electrically connected to each other through a via extending through the insulating layer. Referring to FIG. 1, the N numbers of shift register units are in a first region 10 of the peripheral area. The input signal line I1 for the shift register unit GOA2 includes a first input signal line segment I1-1 in a same layer as the plurality of gate lines GL1, GL2, and GL3; and a second input signal line segment I1-2 in a same layer as the plurality of data lines DL1, DL2, and DL3. The first input signal line segment I1-1 and the second input signal line segment I1-2 are electrically connected to each other through a via V1 extending through an insulating layer separating a layer containing the plurality of gate lines from a layer containing the plurality of data lines. The reset signal line R2 for the shift register unit GOA2 includes a first reset signal line segment R2-1 in a same layer as the plurality of gate lines GL1, GL2, and GL3; and a second reset signal line segment R2-2 in a same layer as the plurality of data lines DL1, DL2, and DL3. The first reset signal line segment R2-1 and the second reset signal line segment R2-2 are electrically connected to each other through a via V4 extending through the insulating layer separating the layer containing the plurality of gate lines from the layer containing the plurality of data lines. Similarly, the input signal line I2 for the shift register unit GOA3 includes a first input signal line segment I2-1 in a same layer as the plurality of gate lines GL1, GL2, and GL3; and a second input signal line segment I2-2 in a same layer as the plurality of data lines DL1, DL2, and DL3. The first input signal line segment I2-1 and the second input signal line segment I2-2 are electrically connected to each other through a via V3 extending through the insulating layer separating the layer containing the plurality of gate lines from the layer containing the plurality of data lines. Similarly, the reset signal line R1 for the shift register unit GOA1 includes a first reset signal line segment R1-1 in a same layer as the plurality of gate lines GL1, GL2, and GL3; and a second reset signal line segment R1-2 in a same layer as the plurality of data lines DL1, DL2, and DL3. The first reset signal line segment R1-1 and the second reset signal line segment R1-2 are electrically connected to each other through a via V2 extending through the insulating layer separating the layer containing the plurality of gate lines from the layer containing the plurality of data lines.

Referring to FIG. 5, FIG. 4, and FIG. 1, the display apparatus in some embodiments further includes a plurality of multiplexers MUX and a plurality of clock terminals CT. As shown in FIG. 5, each of the plurality of clock terminals CT is electrically connected to one of the plurality of data lines DL. Each of the plurality of clock terminals CT is electrically connected to one of the plurality of multiplexers MUX through a connection line CL. The connection line CL is in a same layer as the plurality of gate lines GL1, GL2, and GL3, the first input signal line segments I1-1 and I2-1, and the first reset signal line segments R1-1 and R2-1. The connection line CL crosses over the second input signal line segment and the second reset signal line segment. In one example, a connection line CL crosses over the second input signal line segment I1-2 and the second reset signal line segment R1-2. In another example, a connection line CL crosses over the second input signal line segment I2-2 and the second reset signal line segment R2-2. By having this design, the cross-coupling between the connection line CL and the signal lines of the shift register units can be substantially minimized, leading to a reduced loading.

In some embodiments, and as shown in FIG. 5, the plurality of multiplexers MUX are adjacent to the display area DA. The first region 10 of the gate-driver-on-array circuit GOA is adjacent to the plurality of multiplexers MUX and on a side of the plurality of multiplexers MUX distal to the display area DA. The plurality of clock terminals CT are on a side of the N numbers of shift register units (e.g., the shift register units GOA1, GOA2, and GOA3) in the first region 10 distal to the plurality of multiplexers MUX. As shown in FIG. 5, each of the plurality of clock terminals CT can be disposed in a space (e.g., a concave space) between adjacent shift register units, e.g., in a space between the shift register unit GOA1 and the shift register unit GOA2, or in a space between the shift register unit GOA2 and the shift register unit GOA3. By disposing the plurality of clock terminals CT in the concave space between adjacent shift register units, the total space of the display apparatus can be minimized.

Figure 6:
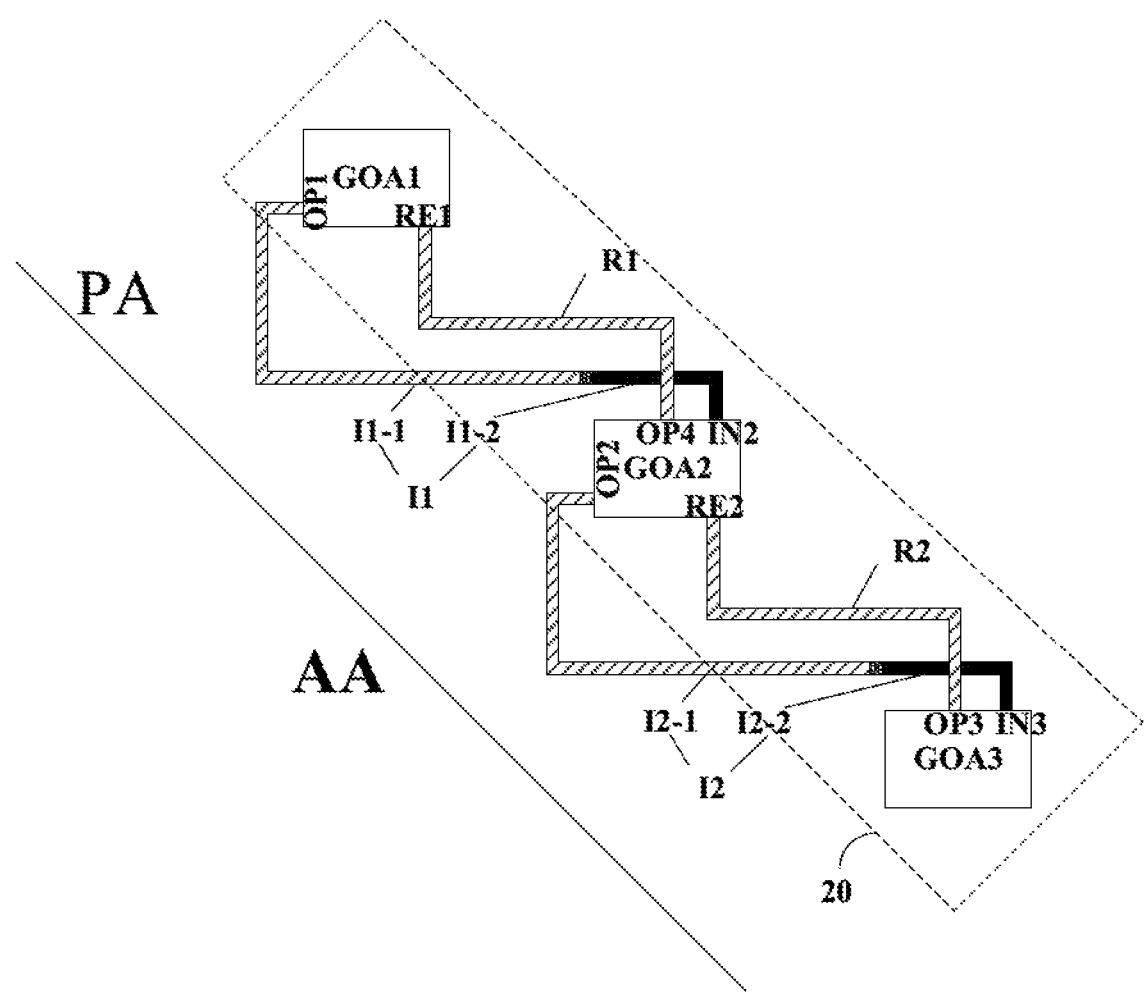
FIG. 6 is a schematic diagram illustrating the structure of a region of a display apparatus in some embodiments according to the present disclosure.

FIG. 6 is a schematic diagram illustrating the structure of a region of a display apparatus in some embodiments according to the present disclosure. FIG. 6 shows a region of the display apparatus around the second region 20 corresponding to the gate-driver-on-array circuit as shown in FIG. 2. Referring to FIG. 6, FIG. 4, and FIG. 2, the gate-driver-on-array circuit GOA in some embodiments includes N numbers of shift register units cascaded in series for respectively outputting a plurality of gate scanning signals to a plurality of gate lines in a display apparatus. An n-th shift register unit of the N numbers of shift register units includes an input port for receiving an input signal from an output port of a m-th (e.g., an (n−1)-th) shift register unit through an input signal line, and a reset port for receiving a reset signal from an output port of a p-th (e.g., an (n+1)-th) shift register unit through a reset signal line, $1 \leq m < n < p \leq N$. Optionally, m is (n−1). Optionally, p is (n+1). Optionally, m is (n−2). Optionally, p is (n+2). Optionally, m is (n−3). Optionally, p is (n+3). As shown in FIG. 6 and FIG. 2, three shift register units GOA1, GOA2, GOA3 are cascaded in series. The N numbers of shift register units are in a second region 20 of the peripheral area. The input signal line I1 for the shift register unit GOA2 includes a first input signal line segment I1-1 in a same layer as the plurality of gate lines; and a second input signal line segment I1-2 in a same layer as the plurality of data lines. The first input signal line segment I1-1 and the second input signal line segment I1-2 are electrically connected to each other through a via V1 extending through the insulating layer separating the layer containing the plurality of gate lines from the layer containing the plurality of data lines. Similarly, the input signal line I2 for the shift register unit GOA3 includes a first input signal line segment I2-1 in a same layer as the plurality of gate lines; and a second input signal line segment I2-2 in a same layer as the plurality of data lines. The first input signal line segment I2-1 and the second input signal line segment I2-2 are electrically connected to each other through a via V2 extending through the insulating layer separating the layer containing the plurality of gate lines from the layer containing the plurality of data lines. The reset signal line R1 for the shift register unit GOA1 is an integral signal line in a same layer as the plurality of gate lines. The reset signal line R2 for the shift register unit GOA2 is an integral signal line in a same layer as the plurality of gate lines. Optionally, the reset signal line in the second region crosses over the second input signal line segment. For example, the reset signal line R1 for the shift register unit GOA1 crosses over the second input signal line segment I1-2. The reset signal line R2 for the shift register unit GOA2 crosses over the second input signal line segment I2-2.

Figure 7:
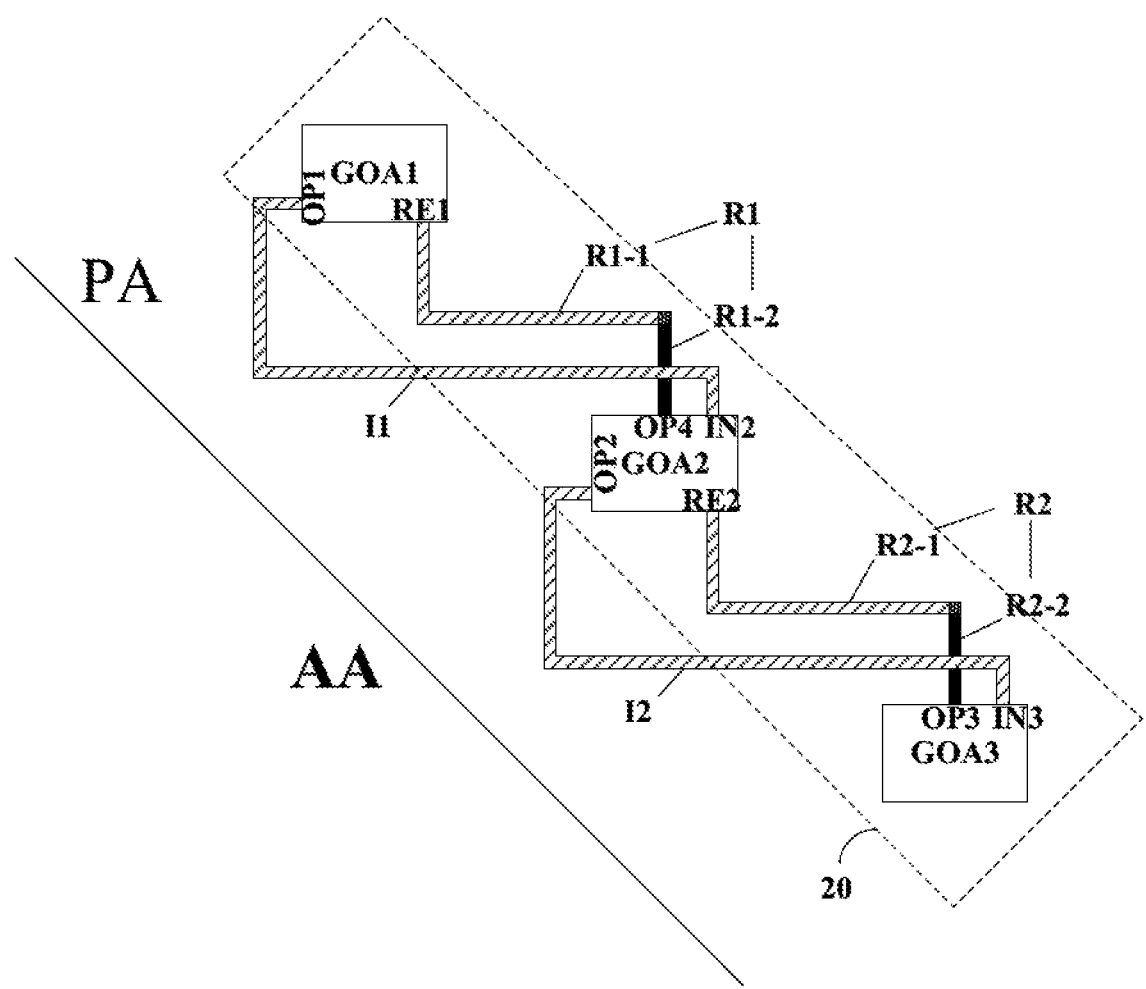
FIG. 7 is a schematic diagram illustrating the structure of a region of a display apparatus in some embodiments according to the present disclosure.

FIG. 7 is a schematic diagram illustrating the structure of a region of a display apparatus in some embodiments according to the present disclosure. FIG. 7 shows a region of the display apparatus around the second region 20 corresponding to the gate-driver-on-array circuit as shown in FIG. 3. Referring to FIG. 7, FIG. 4, and FIG. 3, the gate-driver-on-array circuit GOA in some embodiments includes N numbers of shift register units cascaded in series for respectively outputting a plurality of gate scanning signals to a plurality of gate lines in a display apparatus. An n-th shift register unit of the N numbers of shift register units includes an input port for receiving an input signal from an output port of a m-th (e.g., an (n−1)-th) shift register unit through an input signal line, and a reset port for receiving a reset signal from an output port of a p-th (e.g., an (n+1)-th) shift register unit through a reset signal line, $1 \leq m < n < p \leq N$. Optionally, m is (n−1). Optionally, p is (n+1). Optionally, m is (n−2). Optionally, p is (n+2). Optionally, m is (n−3). Optionally, p is (n+3). As shown in FIG. 7 and FIG. 3, three shift register units GOA1, GOA2, GOA3 are cascaded in series. The N numbers of shift register units are in a second region 20 of the peripheral area. The reset signal line R2 for the shift register unit GOA2 includes a first reset signal line segment R2-1 in a same layer as the plurality of gate lines, and a second reset signal line segment R2-2 in a same layer as the plurality of data lines. The first reset signal line segment R2-1 and the second reset signal line segment R2-2 are electrically connected to each other through a via V2 extending through the insulating layer separating the layer containing the plurality of gate lines from the layer containing the plurality of data lines. Similarly, the reset signal line R1 for the shift register unit GOA1 includes a first reset signal line segment R1-1 in a same layer as the plurality of gate lines, and a second reset signal line segment R1-2 in a same layer as the plurality of data lines. The first reset signal line segment R1-1 and the second reset signal line segment R1-2 are electrically connected to each other through a via V1 extending through the insulating layer separating the layer containing the plurality of gate lines from the layer containing the plurality of data lines. The input signal line I1 for the shift register unit GOA2 is an integral signal line in a same layer as the plurality of gate lines. The input signal line I2 for the shift register unit GOA3 is an integral signal line in a same layer as the plurality of gate lines. Optionally, the input signal line in the second region 20 crosses over the second reset signal line segment. For example, the input signal line I1 for the shift register unit GOA2 crosses over the second reset signal line segment R1-2. The input signal line I2 for the shift register unit GOA3 crosses over the second reset signal line segment R2-2.

Referring to FIG. 4, the gate-driver-on-array circuit GOA in some embodiments is disposed in a first region 10, a second region 20, a third region 30, and a fourth region 40. The gate-driver-on-array circuit GOA in the first region includes N1 numbers of shift register units cascaded in series. The gate-driver-on-array circuit GOA in the second region includes N2 numbers of shift register units cascaded in series. The gate-driver-on-array circuit GOA in the third region includes N3 numbers of shift register units cascaded in series. The gate-driver-on-array circuit GOA in the fourth region includes N4 numbers of shift register units cascaded in series.

In the first region 10, an n1-th shift register unit of the N1 numbers of shift register units includes an input port for receiving an input signal from an output port of a m1-th (e.g., an (n1−1)-th) shift register unit through an input signal line, and a reset port for receiving a reset signal from an output port of a p1-th (e.g., an (n1+1)-th) shift register unit through a reset signal line, $1 \leq m1 < n1 < p1 \leq N1$. Optionally, m1 is (n1−1). Optionally, p1 is (n1+1). Optionally, m1 is (n1−2). Optionally, p1 is (n1+2). Optionally, m1 is (n1−3). Optionally, p1 is (n1+3). The input signal line for the n1-th shift register unit includes a first input signal line segment in a same layer as the plurality of gate lines, and a second input signal line segment in a same layer as the plurality of data lines, the first input signal line segment and the second input signal line segment electrically connected to each other through a via extending through the insulating layer. The reset signal line for the n1-th shift register unit includes a first reset signal line segment in a same layer as the plurality of gate lines, and a second reset signal line segment in a same layer as the plurality of data lines, the first reset signal line segment and the second reset signal line segment electrically connected to each other through a via extending through the insulating layer.

Similarly, in the third region 30, an n3-th shift register unit of the N3 numbers of shift register units includes an input port for receiving an input signal from an output port of a m3-th (e.g., an (n3−1)-th) shift register unit through an input signal line, and a reset port for receiving a reset signal from an output port of a p3-th (e.g., an (n3+1)-th) shift register unit through a reset signal line, $1 \leq m3 < n3 < p3 \leq N3$. Optionally, m3 is (n3−1). Optionally, p3 is (n3+1). Optionally, m3 is (n3−2). Optionally, p3 is (n3+2). Optionally, m3 is (n3−3). Optionally, p3 is (n3+3). The input signal line for the n3-th shift register unit comprises a third input signal line segment in a same layer as the plurality of gate lines, and a fourth input signal line segment in a same layer as the plurality of data lines, the third input signal line segment and the fourth input signal line segment electrically connected to each other through a via extending through the insulating layer. The reset signal line for the n3-th shift register unit comprises a third reset signal line segment in a same layer as the plurality of gate lines, and a fourth reset signal line segment in a same layer as the plurality of data lines, the third reset signal line segment and the fourth reset signal line segment electrically connected to each other through a via extending through the insulating layer.

In the second region 20, an n2-th shift register unit of the N2 numbers of shift register units includes an input port for receiving an input signal from an output port of a m2-th (e.g., an (n2−1)-th) shift register unit through an input signal line, and a reset port for receiving a reset signal from an output port of a p2-th (e.g., an (n2+1)-th) shift register unit through a reset signal line, $1 \leq m2 < n2 < p2 \leq N2$. Optionally, m2 is (n2−1). Optionally, p2 is (n2+1). Optionally, m2 is (n2−2). Optionally, p2 is (n2+2). Optionally, m2 is (n2−3). Optionally, p2 is (n2+3). One of the input signal line and the reset signal line for the n2-th shift register unit includes a first signal line segment in a same layer as the plurality of gate lines, and a second signal line segment in a same layer as the plurality of data lines, the first signal line segment and the second signal line segment electrically connected to each other through a via extending through the insulating layer. Optionally, the input signal line for the n2-th shift register unit includes a first input signal line segment in a same layer as the plurality of gate lines, and a second input signal line segment in a same layer as the plurality of data lines, the first input signal line segment and the second input signal line segment electrically connected to each other through a via extending through the insulating layer, and the reset signal line in the second region crosses over the second input signal line segment (as depicted in FIG. 2 and FIG. 6). Optionally, the reset signal line for the n2-th shift register unit includes a first reset signal line segment in a same layer as the plurality of gate lines, and a second reset signal line segment in a same layer as the plurality of data lines, the first reset signal line segment and the second reset signal line segment electrically connected to each other through a via extending through the insulating layer, and the input signal line in the second region crosses over the second reset signal line segment (as depicted in FIG. 3 and FIG. 7).

Similarly, in the fourth region 40, an n4-th shift register unit of the N4 numbers of shift register units includes an input port for receiving an input signal from an output port of a m4-th (e.g., an (n4−1)-th) shift register unit through an input signal line, and a reset port for receiving a reset signal from an output port of a p4-th (e.g., an (n4+1)-th) shift register unit through a reset signal line, $1 \leq m4 < n4 < p4 \leq N4$. Optionally, m4 is (n4−1). Optionally, p4 is (n4+1). Optionally, m4 is (n4−2). Optionally, p4 is (n4+2). Optionally, m4 is (n4−3). Optionally, p4 is (n4+3). One of the input signal line and the reset signal line for the n4-th shift register unit includes a third signal line segment in a same layer as the plurality of gate lines, and a fourth signal line segment in a same layer as the plurality of data lines, the third signal line segment and the fourth signal line segment electrically connected to each other through a via extending through the insulating layer. Optionally, the input signal line for the n4-th shift register unit includes a first input signal line segment in a same layer as the plurality of gate lines, and a second input signal line segment in a same layer as the plurality of data lines, the first input signal line segment and the second input signal line segment electrically connected to each other through a via extending through the insulating layer, and the reset signal line in the fourth region crosses over the second input signal line segment. Optionally, the reset signal line for the n4-th shift register unit includes a first reset signal line segment in a same layer as the plurality of gate lines, and a second reset signal line segment in a same layer as the plurality of data lines, the first reset signal line segment and the second reset signal line segment electrically connected to each other through a via extending through the insulating layer, and the input signal line in the fourth region crosses over the second reset signal line segment.

In some embodiments, and referring to FIG. 4, each of the plurality of clock terminals CT is electrically connected to one of the plurality of multiplexers MUX through a connection line; the connection line is in a same layer as the plurality of gate lines, the first input signal line segment, the first reset signal line segment, the third input signal line segment, and the third reset signal line segment; the connection line of each of the plurality of clock terminals CT adjacent to the first region 10 crosses over the second input signal line segment and the second reset signal line segment; and the connection line of each of the plurality of clock terminals CT adjacent to the third region 30 crosses over the fourth input signal line segment and the fourth reset signal line segment.

In some embodiments, and referring to FIG. 4, each of the first region 10 and the third region 30 is adjacent to the plurality of multiplexers MUX and on a side of the plurality of multiplexers MUX distal to the display area DA. The plurality of clock terminals CT adjacent to the first region 10 are on a side of the N1 numbers of shift register units in the first region 10 distal to the plurality of multiplexers MUX. The plurality of clock terminals CT adjacent to the third region 30 are on a side of the N3 numbers of shift register units in the third region 30 distal to the plurality of multiplexers MUX.

Referring to FIG. 4, the display apparatus in some embodiment further includes a rapid discharger RPD adjacent to the display area DA. Optionally, each of the second region 20 and the fourth region 40 is adjacent to the rapid discharger RPD and on a side of the rapid discharger RPD distal to the display area DA.

Referring to FIG. 4, the display apparatus in some embodiment further includes a fan-out area FO adjacent to the plurality of clock terminals CT. The fan-out area FO is on a side of the plurality of clock terminals CT distal to the plurality of multiplexers MUX.

The display area DA may have various appropriate shapes. Optionally, the shape of the display area is non-rectangular and non-square. Optionally, the outline of the display area includes a portion of a round shape. In one example, the display area is a substantially circular display area. Optionally, the outline of the display area includes a portion of an arc shape. Optionally, the outline of the display area includes a portion of a polygonal shape, e.g., a pentagonal shape, a hexagonal shape, an octagonal shape, and so on.

The display apparatus may have various appropriate shapes. Optionally, the shape of the display apparatus is non-rectangular and non-square. Optionally, the outline of the display apparatus includes a portion of a round shape. In one example, a display panel of the display apparatus is a substantially circular display panel. Optionally, the outline of the display panel includes a portion of an arc shape. Optionally, the outline of the display panel includes a portion of a polygonal shape, e.g., a pentagonal shape, a hexagonal shape, an octagonal shape, and so on.

Optionally, the display apparatus is a liquid crystal display apparatus. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc. In one example, the display apparatus is a smart watch.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus having a display area and a peripheral area, comprising:
    a plurality of gate lines;
    a plurality of data lines;
    an insulating layer between the plurality of gate lines and the plurality of data lines;
    a gate-driver-on-array circuit in the peripheral area comprising N numbers of shift register units for respectively outputting a plurality of gate scanning signals to the plurality of gate lines;
    a plurality of multiplexers; and
    a plurality of clock terminals;
    wherein an n-th shift register unit of the N numbers of shift register units comprises an input port for receiving an input signal from an output port of a m-th shift register unit through an input signal line, and a reset port for receiving a reset signal from an output port of a p-th shift register unit through a reset signal line, $1 \leq m < n < p \leq N$; and
    at least one of the input signal line and the reset signal line comprises a first segment in a same layer as the plurality of gate lines, and a second segment in a same layer as the plurality of data lines; and
    the first segment and the second segment are electrically connected to each other through a via extending through the insulating layer;
    wherein the N numbers of shift register units are in a first region of the peripheral area;
    the input signal line for the n-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer; and
    the reset signal line for the n-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer;
    wherein each of the plurality of clock terminals is electrically connected to one of the plurality of data lines;
    each of the plurality of clock terminals is electrically connected to one of the plurality of multiplexers through a connection line;
    the connection line is in a same layer as the plurality of gate lines, the first input signal line segment, and the first reset signal line segment; and
    the connection line crosses over the second input signal line segment and the second reset signal line segment.

2. The display apparatus of claim 1, wherein the plurality of multiplexers are adjacent to the display area;
    the first region is adjacent to the plurality of multiplexers and on a side of the plurality of multiplexers distal to the display area; and
    the plurality of clock terminals are on a side of the N numbers of shift register units in the first region distal to the plurality of multiplexers.

3. The display apparatus of claim 1, wherein the N numbers of shift register units are in a second region of the peripheral area;
    the input signal line for the n-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer; and
    the reset signal line is an integral signal line in a same layer as the plurality of gate lines.

4. The display apparatus of claim 1, wherein the N numbers of shift register units are in a second region of the peripheral area;
    the reset signal line for the n-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer; and the input signal line is an integral signal line in a same layer as the plurality of gate lines.

5. The display apparatus of claim 1, wherein the display area has a non-rectangular and non-square shape.

6. The display apparatus of claim 1, wherein the display area has a substantially circular shape.

7. The display apparatus of claim 1, wherein m is (n−1), and p is (n+1).

8. The display apparatus of claim 1, wherein the display apparatus is a smart watch.

9. The display apparatus of claim 1, wherein the gate-driver-on-array circuit in the peripheral area comprises N1 numbers of shift register units in a first region of the peripheral area, and N2 numbers of shift register units in a second region of the peripheral area;

wherein an n1-th shift register unit of the N1 numbers of shift register units comprises an input port for receiving an input signal from an output port of a m1-th shift register unit through an input signal line, and a reset port for receiving a reset signal from an output port of a p1-th shift register unit through a reset signal line, $1 \leq m1 < n1 < p1 \leq N1$;

an n2-th shift register unit of the N2 numbers of shift register units comprises an input port for receiving an input signal from an output port of a m2-th shift register unit through an input signal line, and a reset port for receiving a reset signal from an output port of a p2-th shift register unit through a reset signal line, $1 \leq m2 < n2 < p2 \leq N2$;

the input signal line for the n1-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer;

the reset signal line for the n1-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer; and one of the input signal line and the reset signal line for the n2-th shift register unit comprises a first signal line segment in a same layer as the plurality of gate lines, and a second signal line segment in a same layer as the plurality of data lines, the first signal line segment and the second signal line segment electrically connected to each other through a via extending through the insulating layer.

10. The display apparatus of claim 9, wherein the input signal line for the n2-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer; and the reset signal line in the second region is an integral signal line in a same layer as the plurality of gate lines.

11. The display apparatus of claim 9, wherein the gate-driver-on-array circuit in the peripheral area further comprises N3 numbers of shift register units in a third region of the peripheral area, and N4 numbers of shift register units in a fourth region of the peripheral area;

wherein an n3-th shift register unit of the N3 numbers of shift register units comprises an input port for receiving an input signal from an output port of a m3-th shift register unit through an input signal line, and a reset port for receiving a reset signal from an output port of a p3-th shift register unit through a reset signal line, $1 \leq m3 < n3 < p3 \leq N3$;

an n4-th shift register unit of the N4 numbers of shift register units comprises an input port for receiving an input signal from an output port of a m4-th shift register unit through an input signal line, and a reset port for receiving a reset signal from an output port of a p4-th shift register unit through a reset signal line, $1 \leq m4 < n4 < p4 \leq N4$;

the input signal line for the n3-th shift register unit comprises a third input signal line segment in a same layer as the plurality of gate lines, and a fourth input signal line segment in a same layer as the plurality of data lines, the third input signal line segment and the fourth input signal line segment electrically connected to each other through a via extending through the insulating layer;

the reset signal line for the n3-th shift register unit comprises a third reset signal line segment in a same layer as the plurality of gate lines, and a fourth reset signal line segment in a same layer as the plurality of data lines, the third reset signal line segment and the fourth reset signal line segment electrically connected to each other through a via extending through the insulating layer; and one of the input signal line and the reset signal line for the n4-th shift register unit comprises a third signal line segment in a same layer as the plurality of gate lines, and a fourth signal line segment in a same layer as the plurality of data lines, the third signal line segment and the fourth signal line segment electrically connected to each other through a via extending through the insulating layer.

12. The display apparatus of claim 11, wherein the input signal line for the n2-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer;

the input signal line for the n4-th shift register unit comprises a third input signal line segment in a same layer as the plurality of gate lines, and a fourth input signal line segment in a same layer as the plurality of data lines, the third input signal line segment and the fourth input signal line segment electrically connected to each other through a via extending through the insulating layer;

the reset signal line in the second region is an integral signal line in a same layer as the plurality of gate lines; and the reset signal line in the fourth region is an integral signal line in a same layer as the plurality of gate lines.

13. The display apparatus of claim 11, wherein the first region, the second region, the third region, and the fourth region are around a periphery of the display area.

14. The display apparatus of claim 13, further comprising a rapid discharger adjacent to the display area; and
each of the second region and the fourth region is adjacent to the rapid discharger and on a side of the rapid discharger distal to the display area.

15. A display apparatus having a display area and a peripheral area, comprising:
a plurality of gate lines;
a plurality of data lines;
an insulating layer between the plurality of gate lines and the plurality of data lines;
a gate-driver-on-array circuit in the peripheral area comprising N numbers of shift register units for respectively outputting a plurality of gate scanning signals to the plurality of gate lines;
a plurality of multiplexers; and
a plurality of clock terminals;
wherein an n-th shift register unit of the N numbers of shift register units comprises an input port for receiving an input signal from an output port of a m-th shift register unit through an input signal line, and a reset port for receiving a reset signal from an output port of a p-th shift register unit through a reset signal line, $1 \leq m < n < p \leq N$; and
at least one of the input signal line and the reset signal line comprises a first segment in a same layer as the plurality of gate lines, and a second segment in a same layer as the plurality of data lines; and
the first segment and the second segment are electrically connected to each other through a via extending through the insulating layer;
wherein each of the plurality of clock terminals is electrically connected to one of the plurality of data lines;
each of the plurality of clock terminals is electrically connected to one of the plurality of multiplexers through a connection line;
the connection line is in a same layer as the plurality of gate lines, the first input signal line segment, the first reset signal line segment, the third input signal line segment, and the third reset signal line segment;
the connection line of each of the plurality of clock terminals adjacent to the first region crosses over the second input signal line segment and the second reset signal line segment; and
the connection line of each of the plurality of clock terminals adjacent to the third region crosses over the fourth input signal line segment and the fourth reset signal line segment;
wherein the gate-driver-on-array circuit in the peripheral area comprises N1 numbers of shift register units in a first region of the peripheral area, and N2 numbers of shift register units in a second region of the peripheral area;
wherein an n1-th shift register unit of the N1 numbers of shift register units comprises an input port for receiving an input signal from an output port of a m1-th shift register unit through an input signal line, and a reset port for receiving a reset signal from an output port of a p1-th shift register unit through a reset signal line, $1 \leq m1 < n1 < p1 \leq N1$;
an n2-th shift register unit of the N2 numbers of shift register units comprises an input port for receiving an input signal from an output port of a m2-th shift register unit through an input signal line, and a reset port for receiving a reset signal from an output port of a p2-th shift register unit through a reset signal line, $1 \leq m2 < n2 < p2 \leq N2$;

the input signal line for the n1-th shift register unit comprises a first input signal line segment in a same layer as the plurality of gate lines, and a second input signal line segment in a same layer as the plurality of data lines, the first input signal line segment and the second input signal line segment electrically connected to each other through a via extending through the insulating layer;
the reset signal line for the n1-th shift register unit comprises a first reset signal line segment in a same layer as the plurality of gate lines, and a second reset signal line segment in a same layer as the plurality of data lines, the first reset signal line segment and the second reset signal line segment electrically connected to each other through a via extending through the insulating layer; and
one of the input signal line and the reset signal line for the n2-th shift register unit comprises a first signal line segment in a same layer as the plurality of gate lines, and a second signal line segment in a same layer as the plurality of data lines, the first signal line segment and the second signal line segment electrically connected to each other through a via extending through the insulating layer;
wherein the gate-driver-on-array circuit in the peripheral area further comprises N3 numbers of shift register units in a third region of the peripheral area, and N4 numbers of shift register units in a fourth region of the peripheral area;
wherein an n3-th shift register unit of the N3 numbers of shift register units comprises an input port for receiving an input signal from an output port of a m3-th shift register unit through an input signal line, and a reset port for receiving a reset signal from an output port of a p3-th shift register unit through a reset signal line, $1 \leq m3 < n3 < p3 \leq N3$;
an n4-th shift register unit of the N4 numbers of shift register units comprises an input port for receiving an input signal from an output port of a m4-th shift register unit through an input signal line, and a reset port for receiving a reset signal from an output port of a p4-th shift register unit through a reset signal line, $1 \leq m4 < n4 < p4 \leq N4$;
the input signal line for the n3-th shift register unit comprises a third input signal line segment in a same layer as the plurality of gate lines, and a fourth input signal line segment in a same layer as the plurality of data lines, the third input signal line segment and the fourth input signal line segment electrically connected to each other through a via extending through the insulating layer;
the reset signal line for the n3-th shift register unit comprises a third reset signal line segment in a same layer as the plurality of gate lines, and a fourth reset signal line segment in a same layer as the plurality of data lines, the third reset signal line segment and the fourth reset signal line segment electrically connected to each other through a via extending through the insulating layer; and
one of the input signal line and the reset signal line for the n4-th shift register unit comprises a third signal line segment in a same layer as the plurality of gate lines, and a fourth signal line segment in a same layer as the plurality of data lines, the third signal line segment and the fourth signal line segment electrically connected to each other through a via extending through the insulating layer;

wherein the first region, the second region, the third region, and the fourth region are around a periphery of the display area.

16. The display apparatus of claim 15, wherein the plurality of multiplexers are adjacent to the display area;
each of the first region and the third region is adjacent to the plurality of multiplexers and on a side of the plurality of multiplexers distal to the display area;
the plurality of clock terminals adjacent to the first region are on a side of the N1 numbers of shift register units in the first region distal to the plurality of multiplexers; and
the plurality of clock terminals adjacent to the third region are on a side of the N3 numbers of shift register units in the third region distal to the plurality of multiplexers.

17. The display apparatus of claim 15, further comprising a fan-out area adjacent to the plurality of clock terminals, and on a side of the plurality of clock terminals distal to the plurality of multiplexers.

\* \* \* \* \*